US008710946B2

(12) United States Patent
Pintgen et al.

(10) Patent No.: US 8,710,946 B2
(45) Date of Patent: Apr. 29, 2014

(54) RUPTURE RESISTANT SYSTEM

(75) Inventors: Florian Peter Pintgen, Niskayuna, NY (US); Paul Alfred Siemers, Clifton Park, NY (US); Malcolm Graham Smith, Jr., Haughton, LA (US)

(73) Assignee: General Electric Company, Schenectady, NY (US)

( * ) Notice: Subject to any disclaimer, the term of this patent is extended or adjusted under 35 U.S.C. 154(b) by 356 days.

(21) Appl. No.: 12/212,050

(22) Filed: Sep. 17, 2008

(65) Prior Publication Data

US 2010/0065306 A1 Mar. 18, 2010

(51) Int. Cl.

| | |
|---|---|
| ***H01F 27/02*** | (2006.01) |
| ***H01F 27/08*** | (2006.01) |
| ***H01F 27/10*** | (2006.01) |
| ***H05K 5/00*** | (2006.01) |
| ***H05K 7/20*** | (2006.01) |
| ***H01B 3/24*** | (2006.01) |

(52) U.S. Cl.
USPC ................... 336/90; 336/55; 336/57; 336/58; 336/61; 336/92; 336/94; 174/17 VA; 174/17 LF; 252/570

(58) Field of Classification Search
USPC ........ 336/90, 55, 57, 58, 61, 92, 94; 220/721; 174/17 VA, 17 LF; 252/570
See application file for complete search history.

(56) References Cited

U.S. PATENT DOCUMENTS 1,620,411 A 3/1927 Temple
1,641,247 A 9/1927 Bingay
1,780,319 A 11/1930 Sonneborn
2,142,366 A * 1/1939 Mitschrich ...................... 336/92
2,773,146 A * 12/1956 Sauer .......................... 200/83 R
2,961,476 A * 11/1960 Maslin et al. ................ 174/15.1
3,217,082 A 11/1965 King et al.
3,545,538 A 12/1970 Hinnant
3,644,858 A * 2/1972 Galloway ........................ 336/92
3,921,112 A 11/1975 Broverman
4,453,197 A * 6/1984 Burrage ........................ 361/272
4,745,966 A 5/1988 Avery
4,775,849 A 10/1988 Lucas
4,939,833 A 7/1990 Thomas
6,522,229 B2 2/2003 Laine et al.

(Continued)

FOREIGN PATENT DOCUMENTS

CN 2063279 U 10/1990
CN 2217259 1/1996

(Continued)

OTHER PUBLICATIONS

Non-Final Office Action Received from USPTO in Related Case U.S. Appl. No. 12/643,214, Dated Jun. 21, 2011.

(Continued)

*Primary Examiner* — Tsz Chan
(74) *Attorney, Agent, or Firm* — Fletcher Yoder, P.C.

(57) ABSTRACT

A rupture resistant system comprises a tank comprising a top member, a sidewall member, and a bottom member, and a component situated within the tank and susceptible to creating increasing pressure within the tank when under a fault condition. At least one of the top, sidewall, and bottom members is connected to another of the top, sidewall, and bottom members in a manner so as to cause an increase in inner volume of the tank under increased pressure conditions.

17 Claims, 6 Drawing Sheets

(56) References Cited

U.S. PATENT DOCUMENTS

| | | | | |
|---|---|---|---|---|
| 6,570,479 | B2 | 5/2003 | Colby | |
| 6,726,857 | B2 * | 4/2004 | Goedde et al. | 252/570 |
| 6,804,092 | B1 | 10/2004 | Magnier | |
| 2006/0201799 | A1 | 9/2006 | Carrasco-Aguirre | |
| 2007/0001793 | A1 * | 1/2007 | Magnier | 336/90 |

FOREIGN PATENT DOCUMENTS

| | | | | |
|---|---|---|---|---|
| CN | 2886766 | Y | | 4/2007 |
| DE | 1971624 | | | 11/1967 |
| DE | 1971624 | U1 | * | 11/1967 |
| GB | 334127 | A | | 8/1930 |
| GB | 688952 | A | | 3/1953 |
| GB | 766331 | A | | 1/1957 |
| JP | 0061618 | C | | 1/1924 |
| JP | 37-022923 | Y | | 8/1962 |
| JP | 37-022924 | Y | | 8/1962 |
| JP | 39-026864 | B | | 11/1964 |
| JP | 59-000629 | Y2 | | 12/1980 |
| JP | 56056611 | A | | 5/1981 |
| JP | 57007909 | A | * | 1/1982 |
| JP | 57007911 | A | * | 1/1982 |
| JP | 57007911 | A1 | | 1/1982 |
| JP | 59104108 | A | * | 6/1984 |
| JP | 59104108 | A1 | | 6/1984 |
| JP | H05211107 | A | | 8/1993 |
| KR | 754740 | B1 | * | 9/2007 |
| WO | 0163629 | A1 | | 8/2001 |

OTHER PUBLICATIONS

Final Office Action received from the USPTO in related case U.S. Appl. No. 12/643,214 dated Oct. 31, 2011.
European Search Report dated May 2, 2013; 8 pgs.

* cited by examiner

RUPTURE RESISTANT SYSTEM

CROSS REFERENCE TO RELATED APPLICATIONS

This application is related to U.S. patent application Ser. No. 12/212,062, entitled "System with Directional Pressure Venting", filed concurrently herewith, which is herein incorporated by reference.

BACKGROUND

The subject matter disclosed herein relates generally to transformers, and, more particularly, to a rupture resistant system for transformers that is capable of creating additional volume under increased pressure conditions to mitigate hazards.

Transformer failures result in sudden generation of gases, which increase the pressure inside the transformer tank. Catastrophic rupture of a transformer can occur when the pressure generated by the gases exceeds the transformer's rupture pressure. Such ruptures may result in releasing gases and liquids, which can pose a hazard to the surroundings and pollute the environment.

It would be therefore be desirable to better contain the gases and liquids.

BRIEF DESCRIPTION

In various embodiments disclosed herein, gas containment capabilities are improved by creating volume in the transformer, increasing the rupture pressure of the transformer, or combinations thereof.

More specifically, in accordance with one embodiment disclosed herein, a rupture resistant system comprises a tank comprising a top member, a sidewall member, and a bottom member, and a component situated within the tank and susceptible to creating increasing pressure within the tank when under a fault condition. At least one of the top, sidewall, and bottom members is connected to another of the top, sidewall, and bottom members in a manner so as to cause an increase in inner volume of the tank under increased pressure conditions.

In accordance with another embodiment disclosed herein, a rupture resistant system comprises a tank, a radiator, a header pipe connecting the tank to the radiator, and a component situated within the tank and susceptible to creating increasing pressure within system when under a fault condition. The radiator is configured to increase an inner volume under increased pressure conditions.

In accordance with another embodiment disclosed herein, a transformer system comprises a transformer tank housing a transformer, a radiator, and a header pipe connecting the radiator and the transformer tank. The transformer tank comprises a top member, a sidewall member, and a bottom member, which are connected so as to enable increase in inner volume of the transformer tank under increased pressure conditions. The radiator is also configured to increase an inner volume under increased pressure conditions.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Embodiments disclosed herein include rupture resistant systems. In one embodiment, a rupture resistant system comprises a tank comprising a top member, a sidewall member, and a bottom member and a component situated within the tank and susceptible to creating increasing pressure within the tank when under a fault condition. At least one of the top, sidewall, and bottom members is connected to another of the top, sidewall, and bottom members in a manner so as to cause an increase in inner volume of the tank under increased pressure conditions. In another embodiment, a rupture resistant system comprises a tank, a radiator, and a header pipe connecting the tank to the radiator. The radiator is configured to increase an inner volume under increased pressure conditions. In still another embodiment, the above two embodiments are combined. More specific aspects of these embodiments are described below for purposes of example. Although transformer embodiments are described for purposes of example, the embodiments described herein are useful for systems wherein undesired pressures may occur in a tank and/or radiator. As used herein, singular forms such as "a," "an," and "the" include single and plural referents unless the context clearly dictates otherwise. For example, although a plurality of sidewall members are typically used, in some embodiments, a single side member may be used. Furthermore, the members need not be discrete such that, in some embodiments, a common sheet may be bent to serve as multiple members. The sheet may comprise materials such as, for example, steel, metal alloys, aluminum, and corrosion resistant materials such as polymers and thermoplastics.

Figure 1:
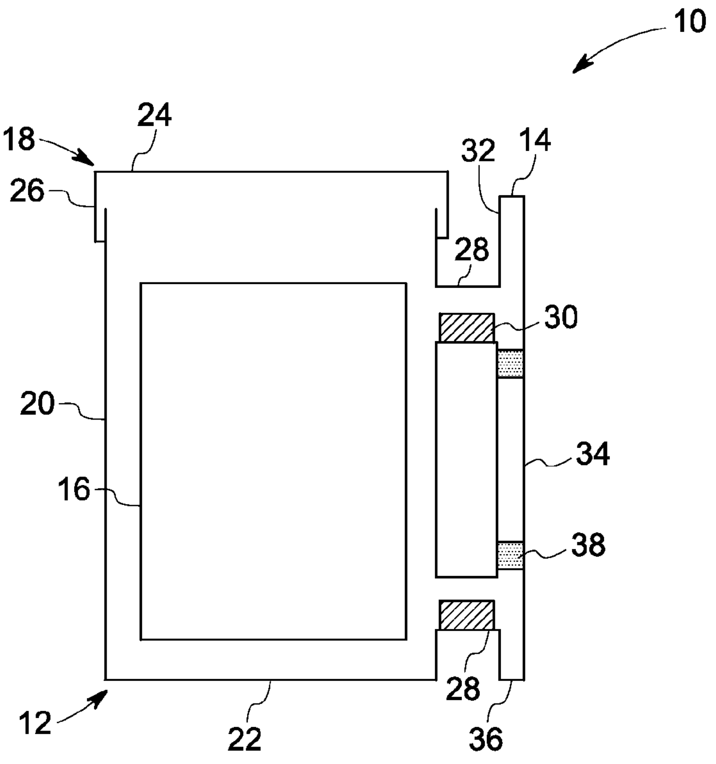
FIG. 1 illustrates an embodiment of a transformer system under normal operating conditions in accordance with aspects disclosed herein.
Figure 4:
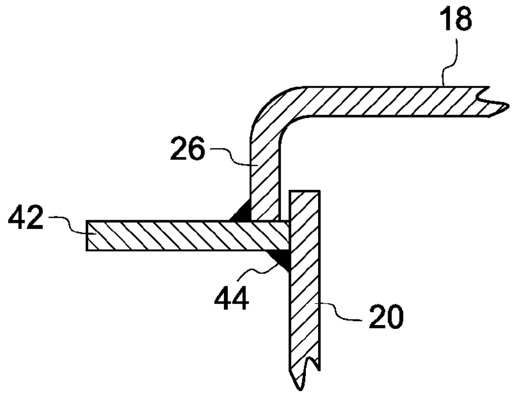
FIG. 4 illustrates an embodiment of a connection between a top member and a sidewall member in accordance with aspects disclosed herein.

FIG. 1 illustrates an embodiment of a rupture resistant system 10 comprising a tank 12, a radiator 14, and a component 16 situated within tank 12. Component 16 is susceptible to creating increasing pressure within tank 12 when under a fault condition. In one embodiment, component 16 comprises a transformer coil and core assembly with accessories, and the tank comprises a transformer tank. Tank 12 comprises a top member 18, a sidewall member 20, and a bottom member 22. In one embodiment, top member 18 comprises a curved member having a top plate 24 and surfaces 26 extending perpendicularly from the top plate and over a portion of sidewall members 20, and top member 18 and sidewall members 20 are coupled by a joint comprising a flange extending from the sidewalls and at least one weld (FIG. 4). Top member 18, bottom member 22, or both may be connected to sidewall member 20 using joints designed to facilitate top member 18 and sidewall members 20 to flex outward to increase inner volume of tank 12 while remaining connected under increased pressure conditions.

Radiator 14 may be connected to tank 12 by header pipes 28. Header pipes 28 have diameters that are larger than conventional header pipe diameters and are sized to permit sufficient flow of gas from the transformer tank to the radiator under increased pressure conditions. Under normal operating conditions, increased header pipe diameters may reduce thermal performance. In one embodiment, header pipes 28 are provided with flow restrictors 30 to control flow from tank 12 to radiator 14. Flow restrictors 30 are configured to be displaced under increased pressure conditions to increase flow from tank 12 to radiator 14. In one example, the header pipes have diameters ranging from six inches to ten inches and having cross sections of four inches when flow restrictors 30 are in place to control flow. In another embodiment, the sum of the cross-sectional areas of the header pipes is adjusted by additionally or alternatively adjusting a number of header pipes. Flow restrictors may optionally be used in this embodiment as well.

Radiator 14 comprises an inner panel 32 and an outer panel 34 connected to the inner panel with inner panel 32 being coupled to header pipes 28. Inner panel 32 and outer panel 34 flex outward to increase inner volume of radiator 14 under increased pressure conditions. In one embodiment, inner panel 32 and outer panel 34 are connected by a circumferential joint 36 that is strong enough to retain connection between the inner and outer panel when the inner panel 32 and the outer panel 34 flex outward. The circumferential joint 36 comprises a joint connecting the peripheries of the inner and outer panels. Spacers 38 may be attached between the inner and outer panels to maintain inner panel 32 and outer panel 34 in a spaced apart relationship.

Figure 2:
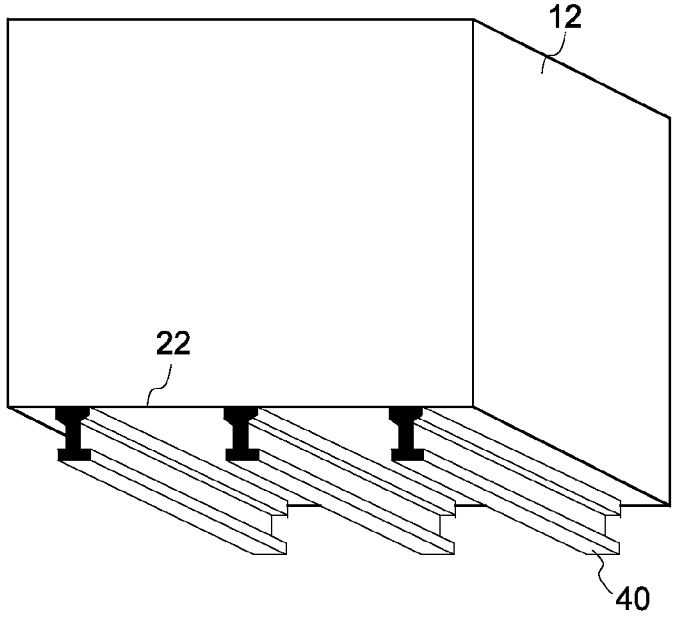
FIG. 2 illustrates an embodiment with an I-beam for providing additional strength to a transformer tank in accordance with aspects disclosed herein.

FIG. 2 illustrates an embodiment for providing additional strength to tank 12. Typically, the bottom of a transformer tank is provided with two I-beams 40 for support. Tank 12 in this embodiment is provided with an additional I-beam 40 in the middle of bottom member 22. The use of additional I-beam 40 reduces bending of bottom member 22 under increased pressure conditions. In another embodiment (not shown), at least one I-beam is coupled diagonally under the bottom member.

Figure 3:
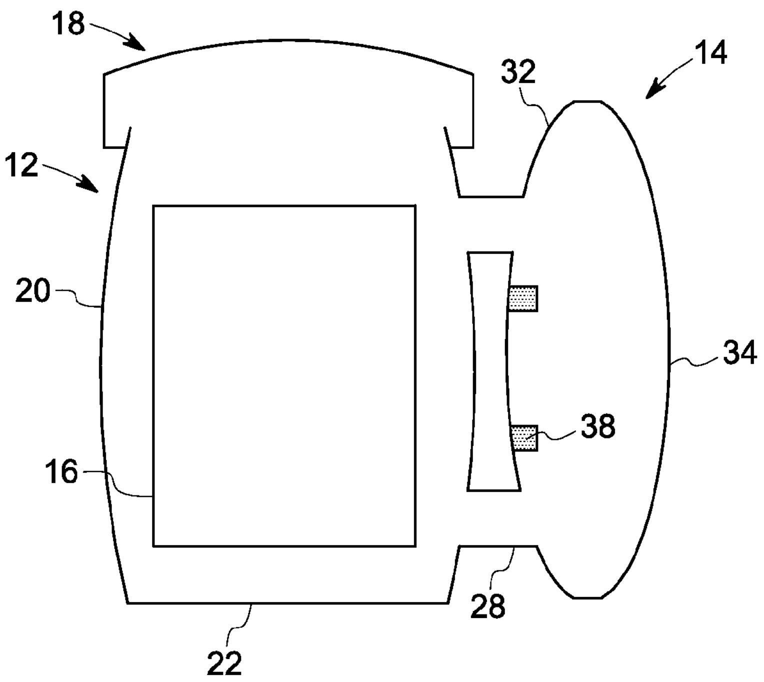
FIG. 3 illustrates an embodiment of the transformer system of FIG. 1 under increased pressure conditions in accordance with aspects disclosed herein.

FIG. 3 illustrates the rupture resistant system under increased pressure conditions. Top member 18 and sidewall members 20 flex outward to create additional volume under increased pressure conditions. Similarly, inner panel 32 and outer panel 34 of radiator 14 also flex outward to create additional volume. The flow restrictors (not shown) are displaced from header pipes 28. As inner panel 32 and outer panel 34 flex outward, spacers 38 are detached from one of the panels (shown as outer panel 34 in FIG. 3). The additional volume thus created increases the amount of gas that the tank 12 and radiator 14 can withstand without rupturing.

FIG. 4 illustrates an embodiment of a connection between top member 18 and sidewall member 20. A flange 42 is welded to an upper portion of an outer surface of sidewall member 20 with a weld 44. The extending surface 26 of top member 18 is welded to the free end of flange 42.

Figure 5:
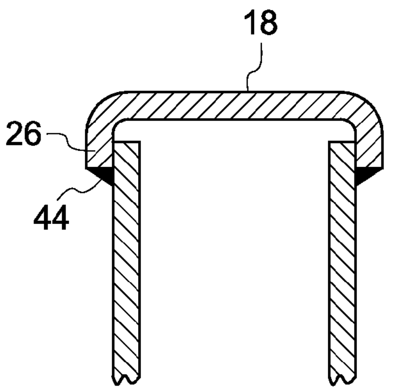
FIG. 5 illustrates another embodiment of a connection between a top member and a sidewall member in accordance with aspects disclosed herein.

FIG. 5 illustrates another embodiment of a connection between top member 18 and sidewall member 20. In this embodiment, the extending surface 26 of top member 18 is welded to the outer surface of the sidewall member 20 with a weld 44.

Figure 6:
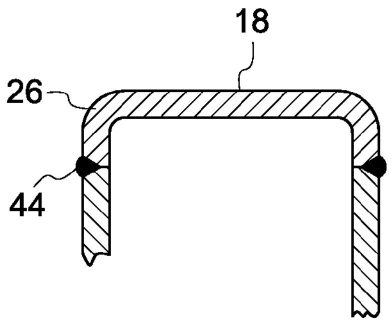
FIG. 6 illustrates another embodiment of a connection between a top member and a sidewall member in accordance with aspects disclosed herein.

FIG. 6 illustrates another embodiment of a connection between top member 18 and sidewall member 20 wherein top member 18 does not extend around the sidewalls and top member is welded to sidewall member 20 with a full penetration weld 46. In this embodiment, an optional plate (not shown) may be positioned on an opposite side of the weld to reduce any sputtering of weld material within the tank.

The embodiments of FIGS. 4-6 are for purposes of example only with other connections also being envisioned. For example, top member 18 need not necessarily have extending surfaces 26. In one embodiment (not shown), for example a flange extends from top member 18 to facilitate the connection. Additionally, any of the above embodiments may be applicable to the connection between bottom member 22 and sidewall members 20 with several additional examples being discussed with respect to FIGS. 7 and 8.

Figure 7:
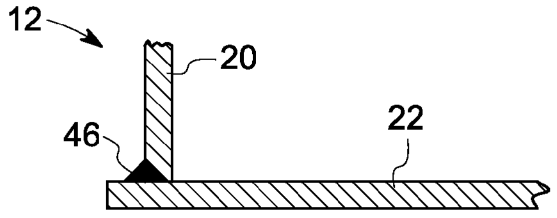
FIG. 7 illustrates an embodiment of a connection between a bottom member and a sidewall member in accordance with aspects disclosed herein.
Figure 8:
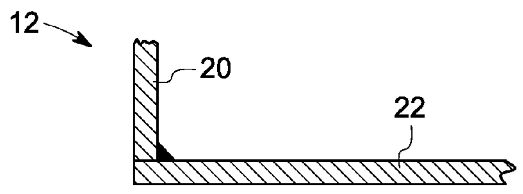
FIG. 8 illustrates another embodiment of a connection between a bottom member and a sidewall member in accordance with aspects disclosed herein.

FIG. 7 illustrates an embodiment of a connection between bottom member 22 and a sidewall member 20 wherein bottom member 22 extends beyond sidewall member 20. In this embodiment sidewall member 20 includes a bevel facing away from the tank, and the joint between the bottom member and the sidewall member comprises a full penetration weld 46. Welding is performed from exterior of tank 12. In another embodiment as shown in FIG. 8, welding is performed from interior of tank 12. The above embodiments of FIGS. 7 and 8 may be applicable to the connection between top and sidewall members.

The connections as described referring to FIGS. 4-8 enable the top member 18 and the sidewall members 20 to flex outward to increase inner volume of the tank 12 under increased pressure conditions while retaining the connection.

Figure 9:
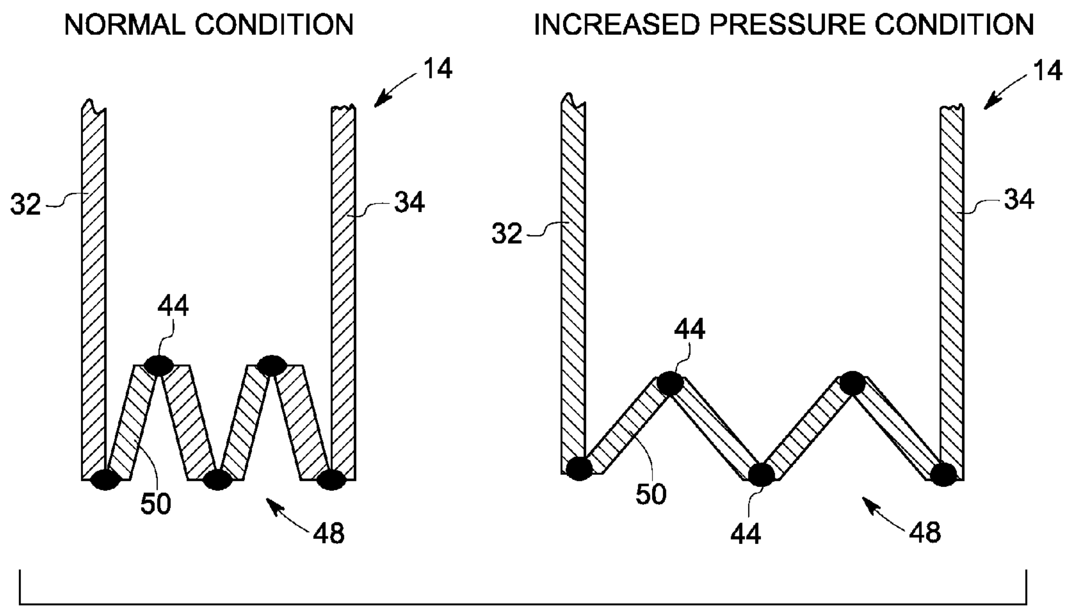
FIG. 9 illustrates an embodiment of a circumferential joint of a radiator in accordance with aspects disclosed herein.

FIG. 9 illustrates an embodiment of a circumferential joint connection 48 connecting inner panel 32 and outer panel 34 of radiator 14. Circumferential joint 48 comprises a series of interconnecting members 50 connected to the inner and outer panels by weld joints 44. Interconnecting members 50 are connected in an inclined relationship by weld joints 44. Under increased pressure conditions, interconnecting members 50 tend to spread outward. The inner panel and the outer panel also flex outward, thereby creating additional volume in the radiator.

Figure 10:
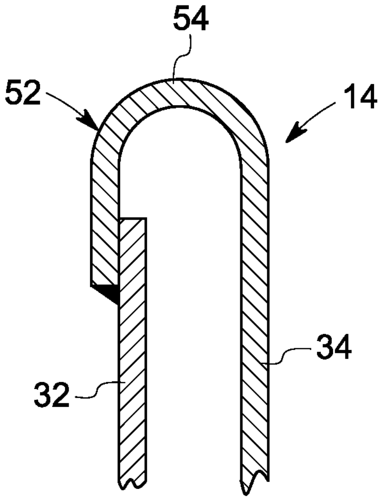
FIG. 10 illustrates another embodiment of a circumferential joint of a radiator in accordance with aspects disclosed herein.

FIG. 10 illustrates another embodiment of a circumferential joint 52 connection between inner panel 32 and outer panel 34 of radiator 14. Circumferential joint 52 comprises an overlapping portion 54 of outer panel 34 that is welded to inner panel 32.

Figure 11:
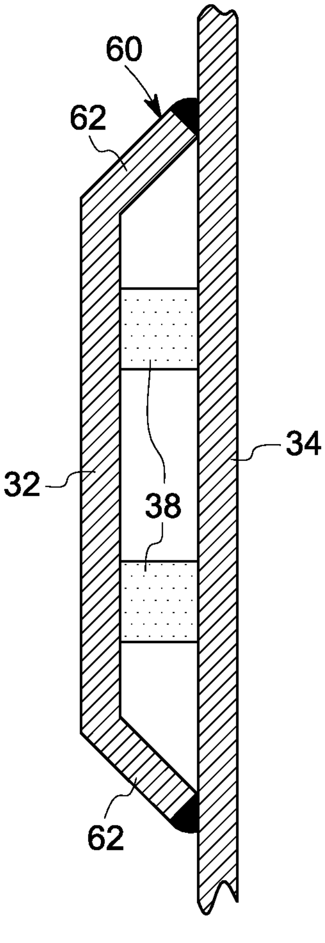
FIG. 11 illustrates another embodiment of a circumferential joint of a radiator in accordance with aspects disclosed herein.

FIG. 11 illustrates another embodiment of a circumferential joint 60 connection between inner panel 32 and outer panel 34 of radiator 14. Circumferential joint 60 comprises a bent portion 62 of inner panel 32 that is welded to outer panel 34. In one embodiment, a stronger weld is provided on topside of radiator and a weaker weld is provided on bottom side of radiator.

Figure 12:
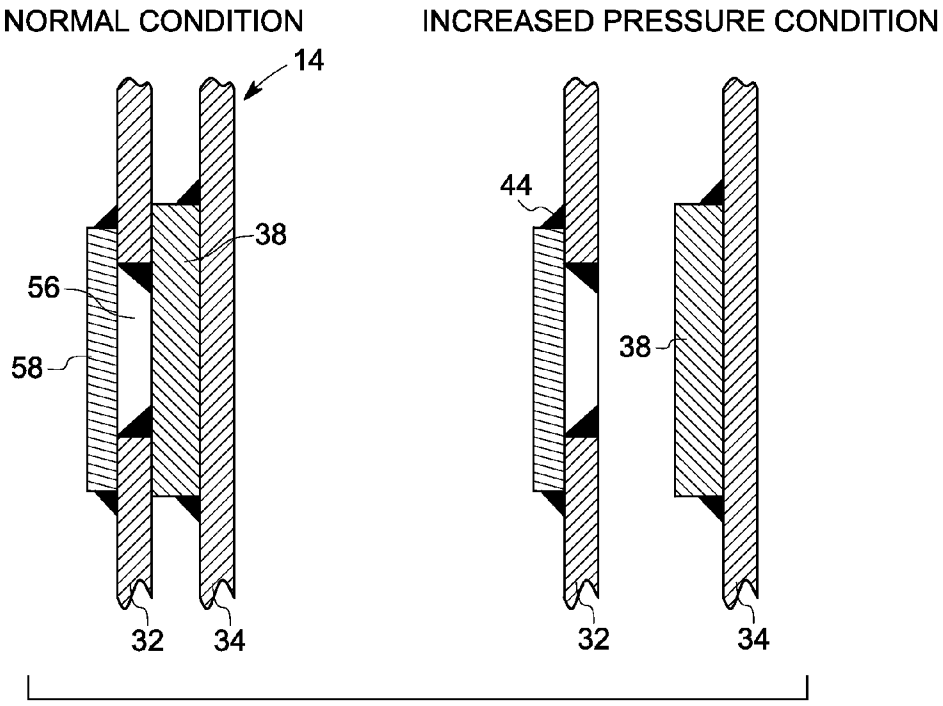
FIG. 12 illustrates an embodiment of a radiator in accordance with aspects disclosed herein.

FIG. 12 illustrates another embodiment of radiator 14 wherein inner panel 32 comprises a hole 56 for each spacer 38 to be attached. The size of spacer 38 is greater than the size of hole 56. In one embodiment, spacer 38 is initially attached to an inner surface of outer panel 34. Inner panel 32 and outer panel 34 are then connected. In this embodiment, spacer 38 is attached at a location on outer panel 34 such that it overlaps the hole 56 in the inner panel 32. A cover member 58 is attached to the outer surface of inner panel 32 to cover the hole 56. In one embodiment, weld joints 44 are used for attaching spacer 38 and cover member 58. Spacer 38 is attached such that spacer 38 detaches from inner panel 32 under increased pressure conditions. Cover member 58 keeps radiator 14 in sealed condition after spacer 38 detaches from the inner panel 32. A single spacer and hole are shown as an example. The radiator can comprise multiple spacers and holes for each spacer.

Figure 13:
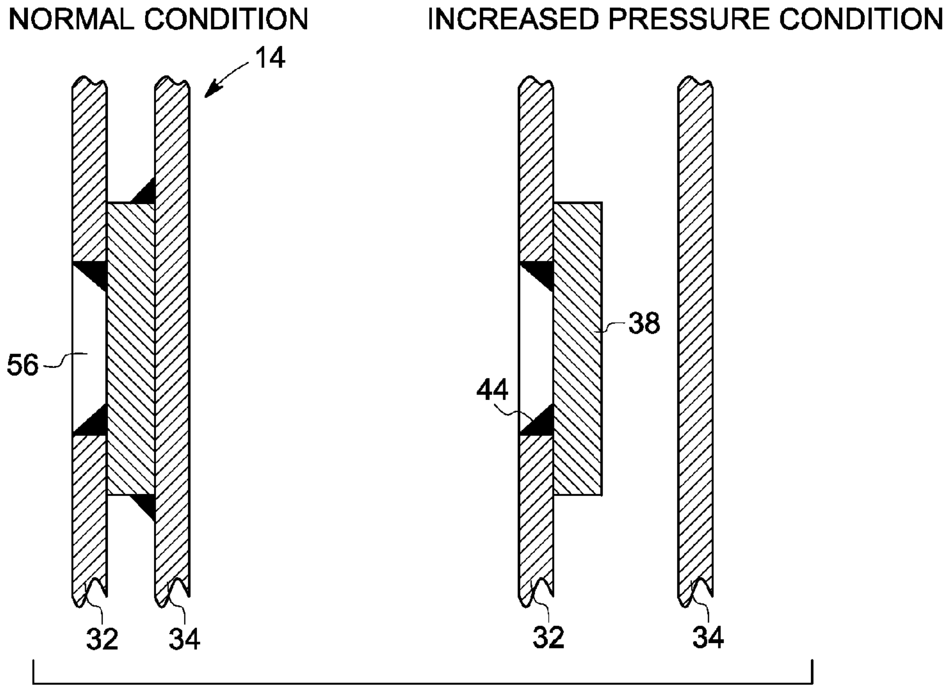
FIG. 13 illustrates another embodiment of a radiator in accordance with aspects disclosed herein.

In another embodiment as shown in FIG. 13, a cover member is not provided. In this embodiment, spacer 38 is attached in a manner so that that spacer 38 detaches from the outer panel 34 under increased pressure conditions. Therefore, spacer 38 keeps radiator 14 in sealed condition after detaching from outer panel 34.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A rupture resistant system, comprising:

a tank comprising a single-piece top member, a sidewall member and a bottom member;

a component situated within the tank and susceptible to creating increasing pressure within the tank when under a fault condition, wherein the top member is connected to the sidewall member and the sidewall member is connected to the bottom member, each in a manner to decrease weld stress pressure and so as to cause an increase in inner volume of the tank under increased pressure conditions, wherein the single-piece top member comprises a top plate and surfaces extending perpendicularly from the top plate to define an overlapping portion wherein an inner portion of the overlapping portion overlaps an exterior of the sidewall member about a complete perimeter of the tank; and a radiator coupled to the tank, wherein the radiator comprises an inner panel, an outer panel, and a spacer coupled to the inner panel and the outer panel, wherein the spacer is configured to detach from the inner panel or the outer panel under increased pressure conditions, wherein the inner panel comprises a rear surface, and wherein the outer panel couples to the rear surface of the inner panel.

2. The system of claim 1, wherein the component is a transformer.

3. The system of claim 2, wherein the radiator is configured to increase an inner volume under increased pressure conditions.

4. The system of claim 2, wherein the top member, the bottom member, or both are connected to the sidewall member using at least one joint that facilitates the top member and the sidewall member to flex outward to increase the inner volume of the tank while remaining connected.

5. The system of claim 4, wherein the top member comprises a curved member extending over a portion of the sidewall member.

6. The system of claim 5, wherein the joint comprises a flange extending from the sidewall member and at least one weld.

7. The system of claim 4, wherein the bottom member extends beyond the sidewall member, the sidewall member includes a bevel facing away from the tank, and the at least one joint between the bottom member and the sidewall member comprises a full penetration weld.

8. The system of claim 2, comprising at least one support beam coupled to the bottom member to reduce bending of the bottom member under increased pressure conditions.

9. A transformer system, comprising:

a transformer;

a transformer tank housing the transformer and comprising a single-piece top member, a sidewall member, and a bottom member, wherein the single-piece top member is connected to the sidewall member and comprises a top plate and surfaces extending perpendicularly from the top plate to define an overlapping portion, wherein an inner portion of the overlapping portion overlaps an exterior of the sidewall member about a complete perimeter of the transformer tank and the sidewall member is connected to the bottom member, each in a manner to decrease weld stress pressure and so as to enable an increase in inner volume of the transformer tank under increased pressure conditions;

a radiator comprising an inner panel, an outer panel, and a spacer coupled to the inner panel and the outer panel, wherein the spacer is configured to detach from the inner panel or the outer panel as the radiator increases in volume under increased pressure conditions; and a header pipe connecting the radiator and the transformer tank, wherein the header pipe comprises a flow restrictor configured to reduce the flow of a fluid between the tank and the radiator during normal operating conditions.

10. The transformer system of claim 9, wherein the top member, the bottom member, or both are connected to the sidewall member using at least one join that facilitates the top member and the sidewall members to flex outward to increase the inner volume of the transformer tank while remaining connected.

11. The transformer system of claim 9, wherein the inner panel couples to the header pipes and the outer panel connects to the inner panel such that the inner panel and the outer panel flex outward to increase the inner volume of the radiator under increased pressure conditions.

12. The transformer system of claim 11, wherein a cover member is provided to keep the radiator in a sealed condition after the spacer detaches from inner panel or the outer panel.

13. The transformer system of claim 11, wherein the inner panel and the outer panel are connected by a circumferential joint.

14. The transformer system of claim 9, wherein the header pipe is configured to permit sufficient flow of gas from the transformer tank to the radiator under increased pressure conditions.

15. A rupture resistant system, comprising:

a tank comprising a single-piece top member, a sidewall member and a bottom member;

a radiator comprising an inner panel and an outer panel connected to the inner panel such that the inner panel and the outer panel flex outward to increase an inner volume of the radiator under increased pressure conditions, and a spacer coupled between the inner panel and the outer panel, wherein the spacer is configured to detach from the inner panel or the outer panel under increased pressure conditions;

a header pipe connecting the tank to the radiator; and a component situated within the tank and susceptible to creating increasing pressure within the tank when under a fault condition; and wherein the single-piece top member is connected to the sidewall member and comprises a top plate and surfaces extending perpendicularly from the top plate to define an overlapping portion wherein an inner portion of the overlapping portion overlaps an exterior of the sidewall member about a complete perimeter of the tank and the sidewall member is connected to the bottom member, each in a manner to decrease weld stress pressure and so as to enable an increase in inner volume of the transformer tank under increased pressure conditions.

16. The system of claim 15, wherein a cover member is provided to keep the radiator in a sealed condition after the spacer detaches from inner panel or the outer panel.

17. The system of claim 15, wherein the inner panel and the outer panel are connected by a circumferential joint.

* * * * *